United States Patent
Johnson et al.

(10) Patent No.: US 7,338,292 B2
(45) Date of Patent: Mar. 4, 2008

(54) BOARD-TO-BOARD ELECTRONIC INTERFACE USING HEMI-ELLIPSOIDAL SURFACE FEATURES

(75) Inventors: Kenneth W Johnson, Colorado Springs, CO (US); Brock J. LaMeres, Colorado Springs, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 11/340,067

(22) Filed: Jan. 26, 2006

(65) Prior Publication Data

US 2007/0173080 A1    Jul. 26, 2007

(51) Int. Cl.
*H01R 12/00* (2006.01)
*H05K 1/00* (2006.01)

(52) U.S. Cl. ....................................................... 439/66

(58) Field of Classification Search .................. 439/66, 439/65, 67, 69, 73, 62, 325, 326, 595
See application file for complete search history.

(56) References Cited

U.S. PATENT DOCUMENTS

| | | | | | |
|---|---|---|---|---|---|
| 4,967,262 | A | * | 10/1990 | Farnsworth | 257/678 |
| 4,975,763 | A | * | 12/1990 | Baudouin et al. | 257/696 |
| 5,122,064 | A | * | 6/1992 | Zarreii | 439/65 |
| 5,432,678 | A | * | 7/1995 | Russell et al. | 361/760 |
| 5,895,281 | A | * | 4/1999 | Rothenberger | 439/326 |
| 6,447,321 | B1 | * | 9/2002 | Perino et al. | 439/326 |
| 6,705,877 | B1 | * | 3/2004 | Li et al. | 439/74 |
| 6,780,028 | B1 | * | 8/2004 | Kennedy et al. | 439/83 |
| 6,846,194 | B2 | * | 1/2005 | Self et al. | 439/329 |
| 6,896,552 | B2 | * | 5/2005 | Kosmala | 439/620.07 |
| 7,097,462 | B2 | * | 8/2006 | Ichikawa | 439/66 |
| 2006/0202675 | A1 | * | 9/2006 | Parker et al. | 324/158.1 |

* cited by examiner

*Primary Examiner*—Chandrika Prasad (57) ABSTRACT

A board-to-board interconnect is presented. The interconnect is fashioned from solder beads or hemi-ellipsoidal surface features on a surface of a printed circuit board and contact pads on a second printed circuit board.

6 Claims, 9 Drawing Sheets

BOARD-TO-BOARD ELECTRONIC INTERFACE USING HEMI-ELLIPSOIDAL SURFACE FEATURES

BACKGROUND

With the operating speed of many electronic devices entering the gigahertz range, smaller physical distances and geometries in electronic product design have become necessary to limit deleterious transmission line effects, such as electronic signal reflections and oscillations. One of several design areas affected by these advances in operating speed is interconnection methodology. In response to these advances, electronic connectors utilized on printed circuit boards (PCBs) have had to become smaller while simultaneously containing more signal conductors or pins. For example, the electrical connection of two printed circuit boards in an electronic system, normally accomplished by way of wire cables and connectors, or by way of standard board-edge connectors, often results in relatively long transmission lines between the two boards, allowing unwanted signal reflections to exist. To mitigate these effects, shorter transmission lines between electronic components in an electronic system are advantageous.

To that end, direct connection between two PCBs in the absence of a standard connector is desirable, as the transmission line lengths for such a connection scheme are reduced to a minimum. The most direct connection between two PCBs involves soldering the edge of one PCB to the side of the second PCB. Unfortunately, such a configuration does not readily facilitate replacement or repair and may not be mechanically stable, making the process of soldering difficult.

Many board-to-board connections are made using a typical, off the shelf connection. These are generally reliable and effective interfaces. However, in some instances, it is preferable to create a custom connection. The reasons for this are varied, but usually include space limitations for the connection, a need to obtain a certain physical ground-to-signal distance (e.g., impedance control, shielding, crosstalk, etc.), or a need to make a connection to mating signals in a custom spacing. In such applications, the cost, reliability, development or availability of materials makes the creation of a custom connector very difficult to undertake or compromises the end result by not supplying all of the needed features for the cost constraints.

The inventors of the present invention have determined a need for customized, small footprint board-to-board connections inexpensively and reliably.

BRIEF DESCRIPTION OF THE DRAWINGS

An understanding of the present teachings can be gained from the following detailed description, taken in conjunction with the accompanying drawings of which.

DETAILED DESCRIPTION

Figure 1:
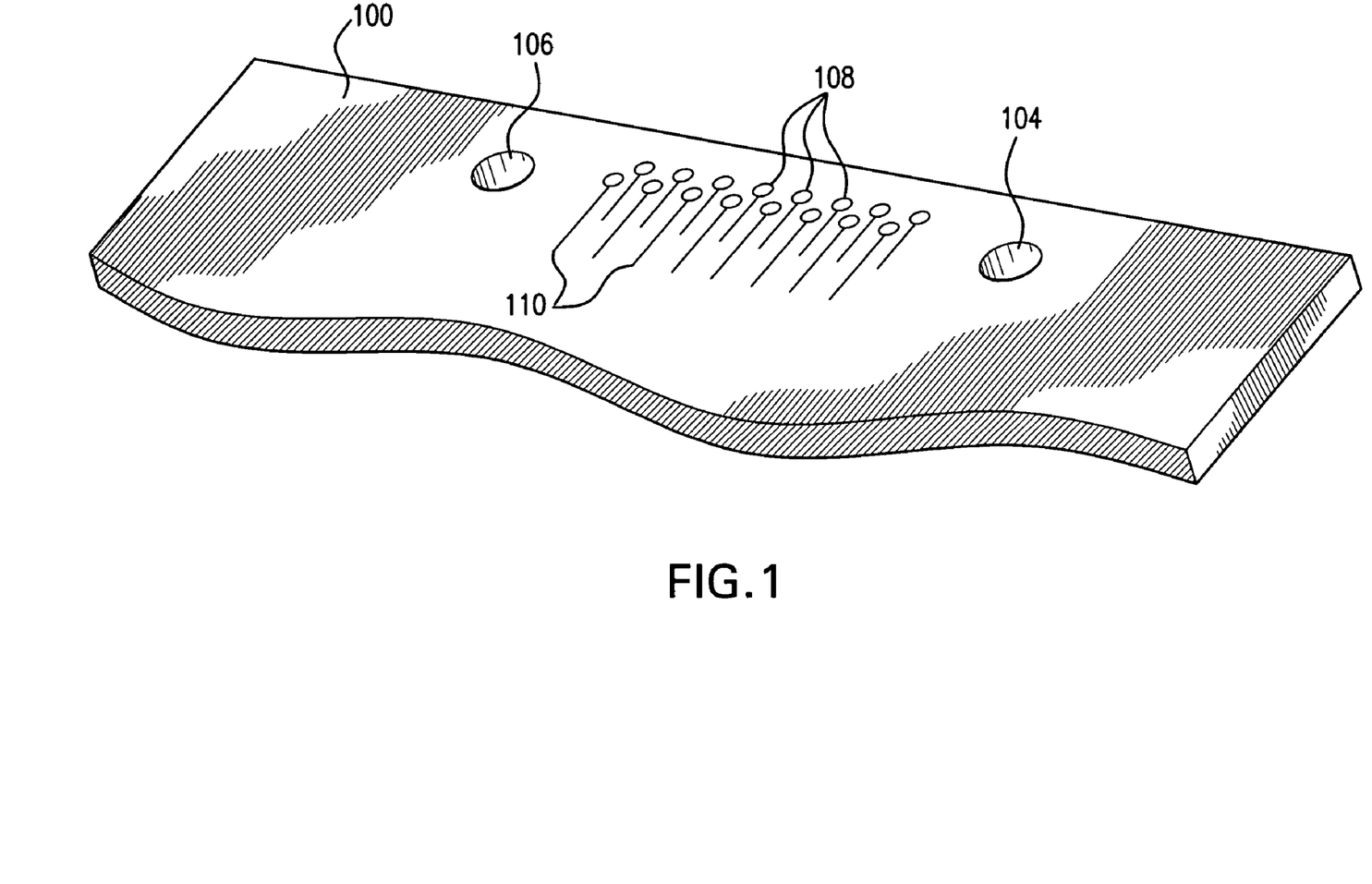
FIG. 1 illustrates an orthogonal, cut-away view of a target board with connection beads prior to mating.

FIG. 1 is an orthogonal view of a connectorless target board 100, such as a printed circuit board. Target board 100 may have hemi-ellipsoidal surface features 108, such as solder beads. The hemi-ellipsoidal surface features 108 may be connected to traces 110 on the surface or within the target board 100. Traces 110 may be connected to components on the target board. The hemi-ellipsoidal surface features 108 may be near or along an edge of the target board 100 or at any location on the target board 100 that a connection is desired with another board. Target board 100 may also have alignment and retention elements 104 and 106, such as one or more holes, in close proximity with the hemi-ellipsoidal surface features 108.

Figure 2:
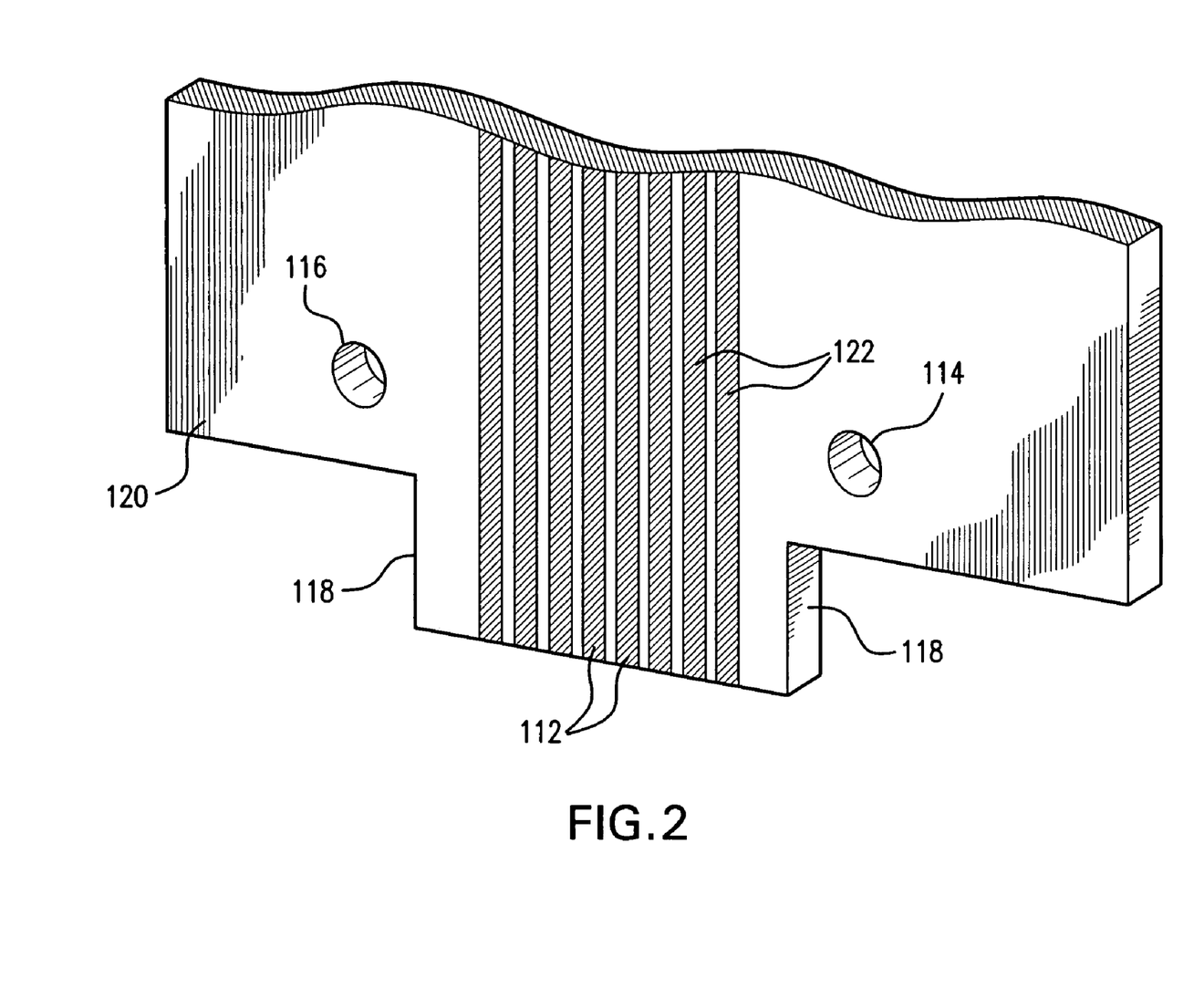
FIG. 2 illustrates an orthogonal, cut-away view of a connecting board with edge connection pads prior to mating.
Figure 3:
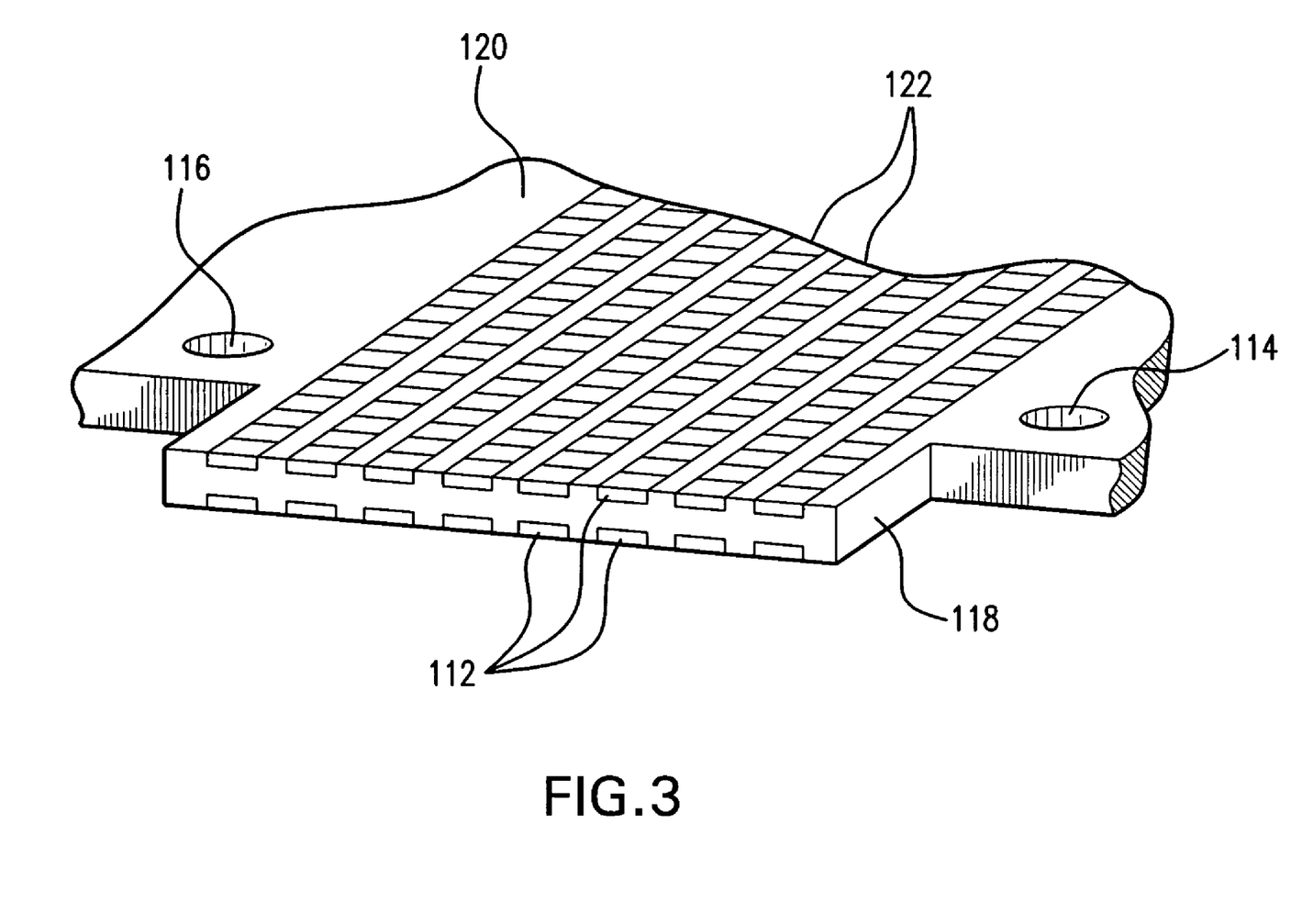
FIG. 3 illustrates an end view of the edge connections pads on the connecting board of FIG. 2.

FIGS. 2 and 3 are orthogonal and edge views respectively of a connecting board 120, such as a printed circuit board or a daughter board to be connected to the target board.

Connecting board 120 may include traces 122. Traces 122 may form pads 112 on an edge of connecting board 120. Traces 122 may connect with one or more electronic components or elements on the connecting board 120. Connecting board 120 may have an attachment member 118 with edge pads 112 running along an edge of the attachment member 118. Connecting board 120 may have alignment and retention elements 114 and 116, such as one or more holes, in close proximity with attachment member 118.

Figure 4:
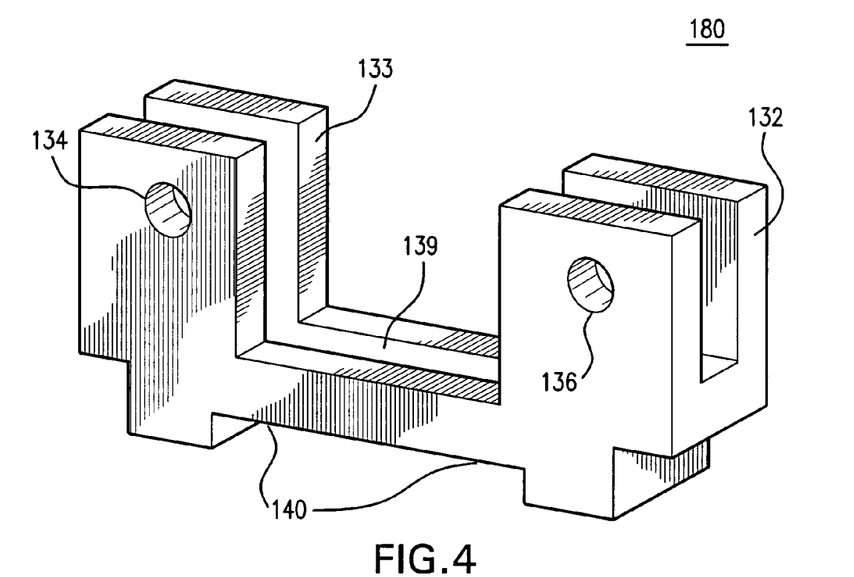
FIG. 4 illustrates an orthogonal view of an alignment and retention member for aligning connection beads of a target board with connection pads of a connecting board.
Figure 5:
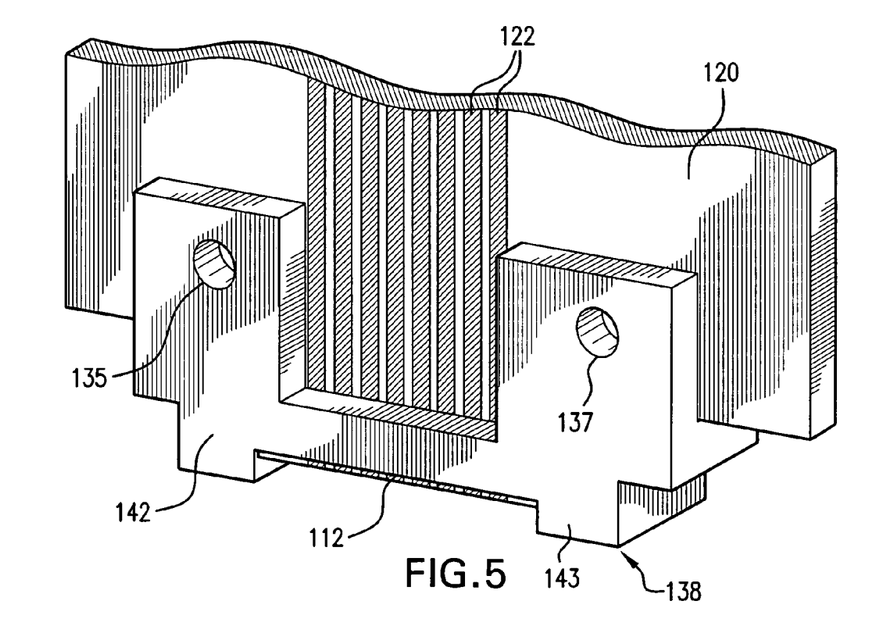
FIG. 5 illustrates an orthogonal view of the alignment body of FIG. 4 assembled with the connecting board of FIGS. 2 and 3.

FIGS. 4 and 5 illustrate an alignment and retention member 180 for aligning connection beads 108 of a target board 100 with connection pads 112 of a connecting board 120. Alignment and retention member 180 may include one or more U-shaped extensions 132 and 133 that wrap around connecting board 120 near attachment member 118 (as shown in FIG. 5). Alignment and retention member 180 may have one or more alignment and retention features 134 and 136, such as holes, on the U-shaped extension for means of aligning and retaining connecting board 120 therein. For example, connecting board 120 may be aligned and retained within one or more U-shaped extensions 132 and 133 of connecting board 120 by aligning holes 114 and 116 of connecting board 120 with holes 134 and 136 of alignment and retention member 180 and securing with screws, rivets, adhesive or other similar means 135 and 137. Alignment and retention member 180 may include a sleeve 139 for receiving attachment member 118, as shown in FIG. 5. Alignment and retention member 180 may include one or more stand-off features 142 and 143. The one or more stand-off features 142 and 143 may have alignment and retention means (not shown), similar to holes 134 and 136 on the one or more U-shaped extensions 132 and 133. Alignment and retention member 180 may be made of plastic, metal, wood, fiberglass or other similar materials by means of injection molding, machining or other know means appropriate for the material being used.

Figure 6:
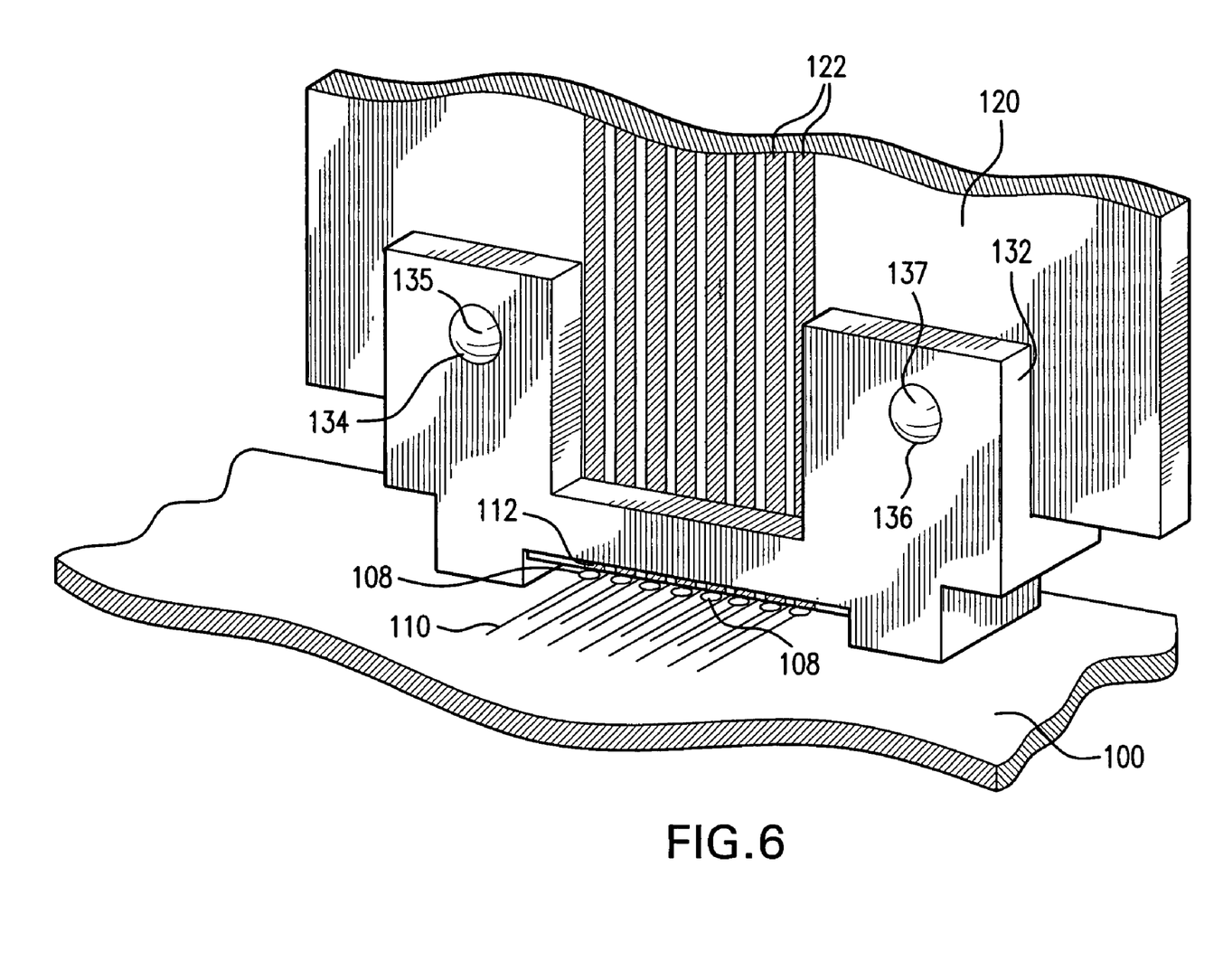
FIG. 6 illustrates the bead-to-pad mated interface between the target board of FIG. 1 and the connecting board of FIGS. 2, 3 and 5.

FIG. 6 illustrates hemi-ellipsoidal surface feature (solder bead) - to - pad mated interface between the target board 100 of FIG. 1 to the connecting board 120 of FIGS. 2, 3, and 5. Specifically, connecting board 120 is mounted in U-shaped extensions 132 and 133 and secured with screws 135 and 137. The contact pads 112 on the edge of connecting board 120 are aligned over corresponding hemi-ellipsoidal surface features (or solder beads) 108 on the target board 100 with similar alignment and retention features (not shown) on one or more stand-off features 142 and 143 or the alignment and retention member 180. The alignment and retention member 180 is secured to the target board 100 by means of screws, clamps, adhesives or other similar means.

As will be readily appreciated from FIG. 6, the alignment and retention member 180 provides alignment between the solder beads 108 on the target board 100 and the edge contact pads 112 on the connecting board 120. The one or more stand-off features 142 and 143 of the alignment and retention member 180 secured to the target board, control the compression between the solder beads 108 and the edge contact pads 112.

Throughout this document, the phrases hemi-ellipsoidal surface feature and solder bead are used interchangeably.

Figure 7A:
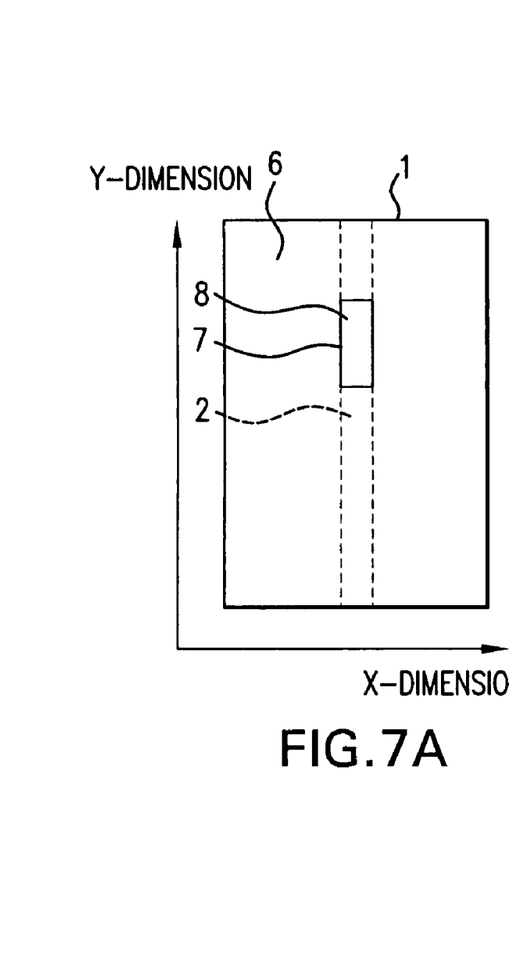
FIG. 7A is a top view of a portion of a printed circuit board showing the x- and y- dimensions in the x-, y-, z-coordinate system of a trace with a hemi-ellipsoidal surface feature.
Figure 7B:
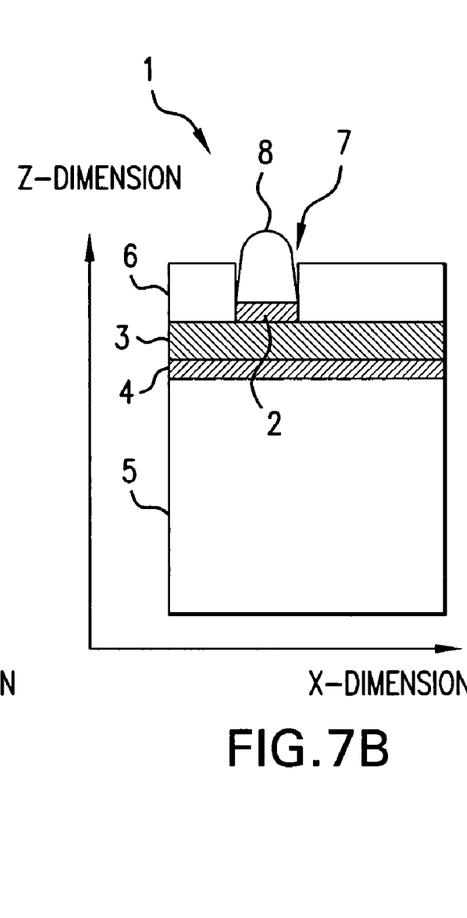
FIG. 7B is a cross-sectional side view showing the x- and z- dimensions in the x-, y-, z-coordinate system of the portion of the printed circuit board and trace of FIG. 7A.
Figure 7C:
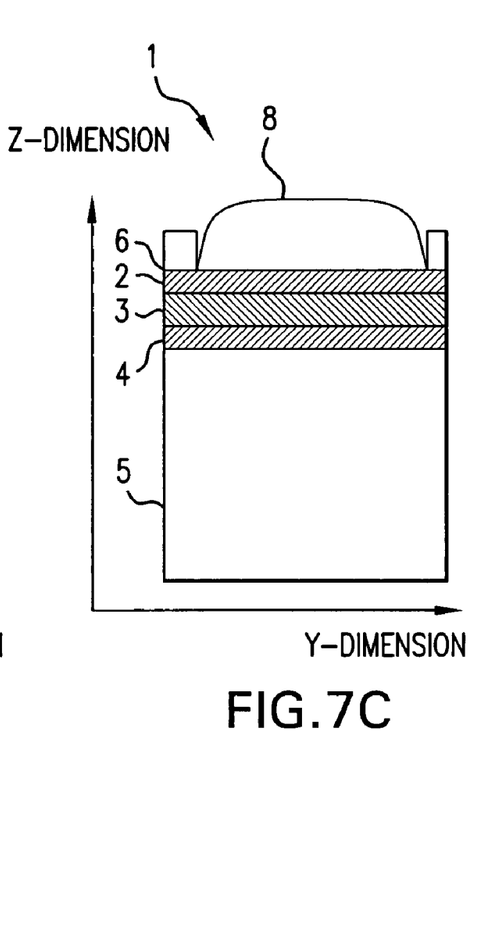
FIG. 7C is a cross-sectional side view of the portion of the printed circuit board and trace of FIGS. 7A and 7B showing the y- and z- dimensions in the x-, y-, z-coordinate system.

An exemplary target board 100 may include a printed circuit board as shown in FIGS. 7A-7C. As shown in FIGS. 7A-7C, a printed circuit board 1 includes a substrate 5, a ground plane 4, and at least one dielectric layer 3 with a trace 2 printed, deposited, or otherwise attached thereon. A solder mask 6 with a hole 7 formed over the trace 2 at a location where a solder bead 8 is positioned is layered over the exposed surfaces of the dielectric layer 3 and trace layer 2. A solder bead 8 is conductively attached to the trace 2 within the solder mask hole 7. The solder bead 8 projects above the exposed surrounding surfaces of the solder mask 6 to form an exposed localized high point on the trace 2 that may be used to make contact with a contact pad of an opposing interconnect part. In one embodiment, the solder bead 8 is a solder bead with a length (in the y-dimension) larger than the width (in the x-dimension) of the trace to provide maximum contact surface.

In one exemplary method of manufacture of solder beads 8, 18, 108 on traces 3, 12, 110 the invention may utilize existing printed circuit board fabrication processes, thereby keeping costs low. As known in the art, virtually every printed circuit board is constructed with high-speed signals appearing on the outer layers due to the ability to more easily control impedances on the outer layers. The two outer layers are also typically coated with a solder mask that is used to assure that only exposed copper (or other conductive materials) areas will retain solder paste that is applied via a screen printing process. Holes in the solder mask assure that only those areas of copper that should be soldered will receive solder paste.

The second interface part 120 may be formed as a flex circuit or a flexible interconnect media, such as ribbon cable, coaxial cable, discrete wires or other known flexible interconnect media. A flex circuit may be manufactured in the same manner as printed circuit board with the dielectric layer of the flex circuit made of a flexible material, such as a high temperature, high strength plastic like polyimide, rather than the more typical rigid dielectric materials (e.g., fiberglass) used in traditional printed circuit boards. Ribbon cables, coaxial cables, discrete wires and the like may be manufactured of any known means, with contact pads or solder beads formed at a predetermined location to form the second side of the interconnect according to the present invention.

Figure 8:
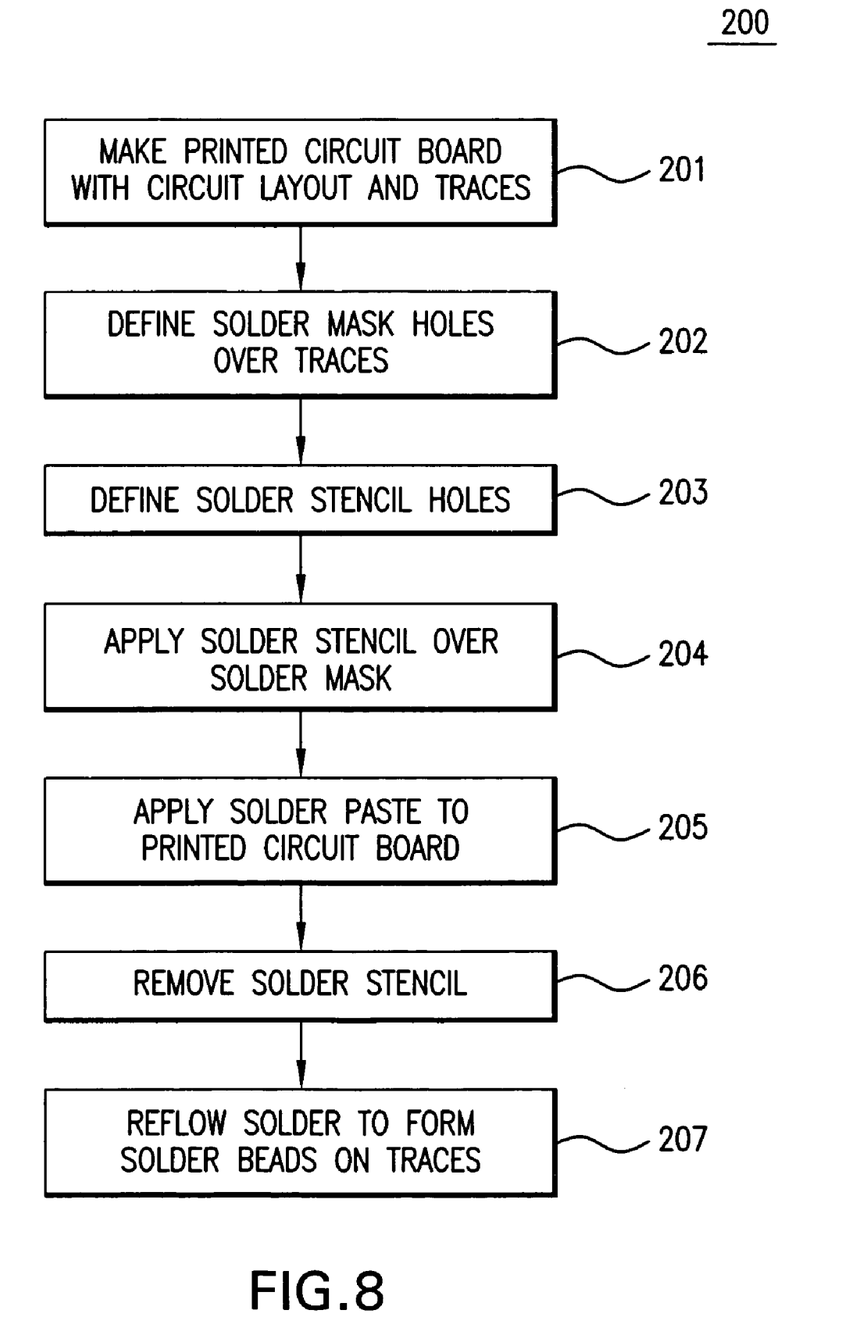
FIG. 8 is a flowchart illustrating a method of manufacture of a hemi-ellipsoidal surface feature on a trace of a printed circuit board.
Figure 9A:
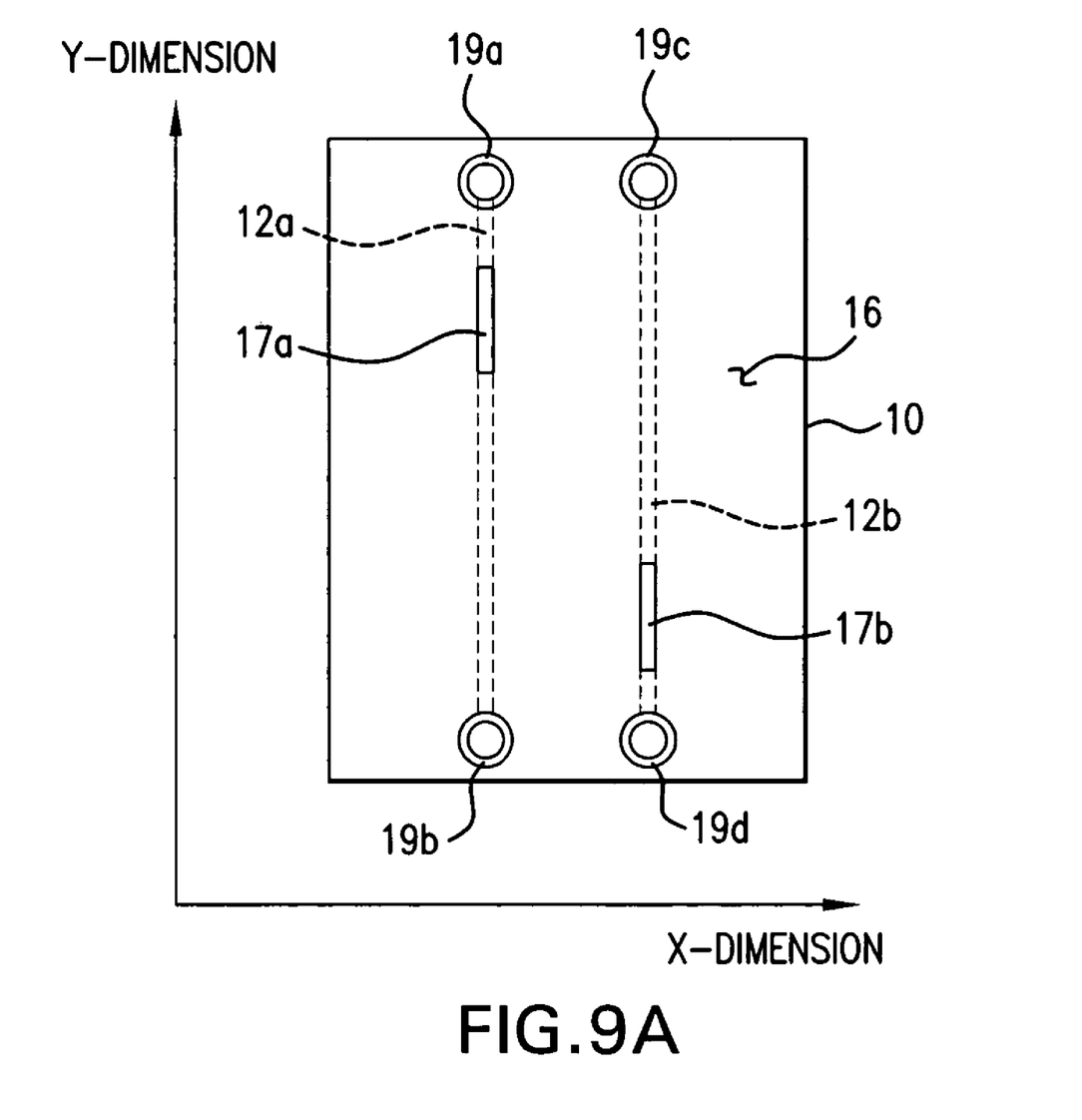
FIG. 9A is a top view of a portion of a printed circuit board showing the x- and y- dimensions in the x-, y-, z-coordinate system of a pair of traces with hemi-ellipsoidal surface features implemented according to the method of FIG. 8.
Figures 9B, 9C:
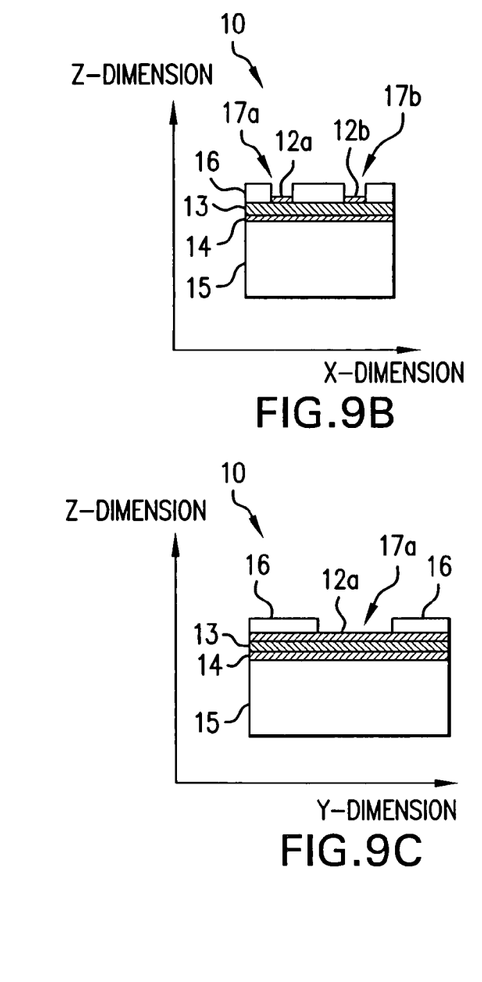
FIG. 9B is a cross-sectional side view showing the x- and z- dimensions in the x-, y-, z-coordinate system of the portion of the printed circuit board and trace of FIG. 9A after application of the solder mask but prior to application of solder paste.
FIG. 9C is a cross-sectional side view showing the y- and z- dimensions in the x-, y-, z-coordinate system of the portion of the printed circuit board and trace of FIGS. 9A and 9B after application of the solder mask but prior to application of solder paste.

FIG. 8 is an operational flowchart illustrating a preferred method 200 of manufacture of a solder bead on a trace of a printed circuit board, and FIGS. 9A-9G include various views of a portion of a printed circuit board 10 during manufacture of solder beads 18a, 18b in accordance with the method of FIG. 8. Referring now to FIG. 8 with additional reference to FIGS. 9A-9G, in the preferred method of manufacture of solder beads of the invention, the printed circuit board 10 is fabricated in step 201 to the point of printing, depositing, or otherwise layering the traces 12a, 12b on which solder beads 18a, 18b are to be implemented. In step 202, solder mask holes 17a, 17b (in addition to holes 19a, 19b, 19c, 19d for the traditional points of solder—e.g., component pin-to-trace solder points) are defined and implemented in the printed circuit board solder mask 16 in locations over traces 12a, 12b at desired solder bead locations, as illustrated in FIGS. 9A, 9B, and 9C;

The positions of solder mask holes 17a, 17b in the solder mask 16 are governed by rules on minimum spacing and proximity to other devices that must be avoided. In step 203, holes are defined in a solder stencil (shown in FIG. 8B) and in step 204 the solder stencil is applied over the mask 16 (shown in FIG. 8C), such that the holes in the solder stencil are aligned over solder mask holes 17a, 17b in the solder mask 16 along a diagonal in the solder stencil.

Figure 9D:
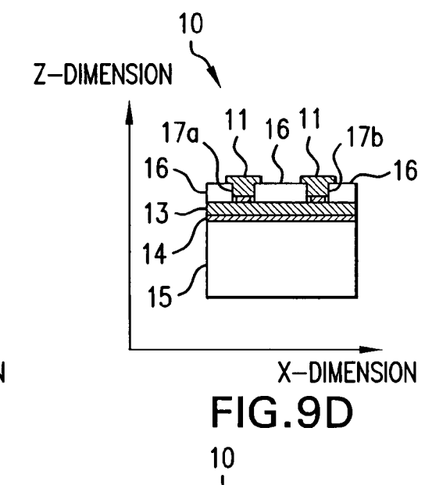
FIG. 9D is a cross-sectional side view showing the x- and z- dimensions in the x-, y-, z-coordinate system of the portion of the printed circuit board and trace of FIGS. 9A-9C after application of solder paste.
Figure 9E:
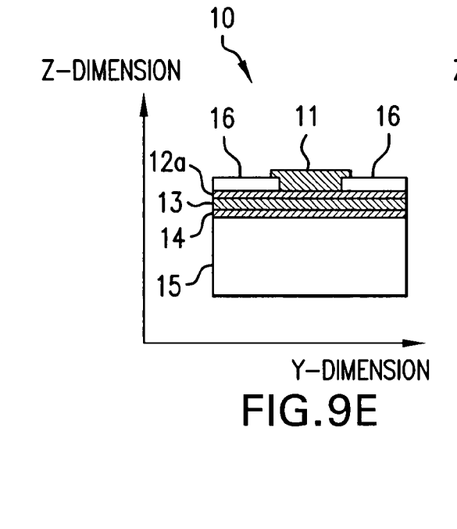
FIG. 9E is a cross-sectional side view showing the y- and z- dimensions in the x-, y-, z-coordinate system of the portion of the printed circuit board and trace of FIGS. 9A-9D after application of solder paste.

Once solder mask holes 17a, 17b are located and the solder mask 16 is produced, printed circuit board fabrication proceeds as is normal in the art. To this end, in step 205, solder paste 11 is applied to the board 10, thereby filling the solder mask holes 17a, 17b, using the standard well-known silk-screen process, as illustrated in hole 17a in FIGS. 9D and 9E. The area of the hole and the thickness of the solder stencil determines the volume of solder paste 11 that ends up in the hole 17a. It should be noted that the solder mask hole 17a, 17b may not be completely filled when the solder paste is deposited, but any voids are filled during the reflow step. In step 206, the solder stencil is removed leaving bricks-or islands 11 of solder paste, as shown in FIGS. 9D and 9E.

Figures 9F, 9G:
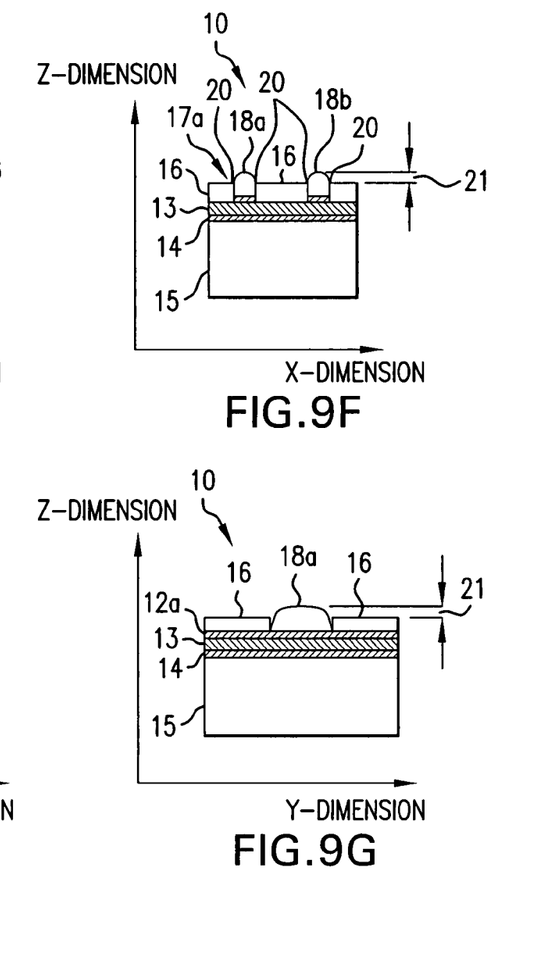
FIG. 9F is a cross-sectional side view showing the x- and z- dimensions in the x-, y-, z-coordinate system of the portion of the printed circuit board and trace of FIGS. 9A-9E after soldering.
FIG. 9G is a cross-sectional side view showing the y- and z- dimensions in the x-, y-, z-coordinate system of the portion of the printed circuit board and trace of FIGS. 9A-9F after soldering.

In step 207, the solder paste is soldered to the conductive areas exposed by the solder mask, for example using a reflow soldering technique. Soldering is a very well understood process. As known in the art, the solder paste may be approximately 50% metal and 50% flux by volume. When the solder paste melts during reflow soldering, the flux burns off, preventing oxidation of the solder and reducing the end volume. Surface tension causes the paste to reform from a rectilinear shape, as defined by mask the hole, into a hemi-ellipsoidal shape defined by the exposed copper. Thus, the melted solder will retract from the walls 20 of solder mask hole 17a in the solder mask 16 and form a solder bead 18, as illustrated in FIGS. 9F and 9O that can project some distance 21 above the solder mask 16. This distance, or solder bead thickness 21 in the z-dimension of the x-, y-, z-coordinate system, is determined by the area of the exposed trace 12a, 12b and the original volume of the solder paste 11.

When the solder is reflowed, it will spread out on the trace 12 due to its affinity for copper or other conductive material and it will exit the solder mask 16 due to its lack of affinity for the mask material. Thus, the molten solder will bead up on the exposed copper or other conductive trace material 12.

The dimensions of the solder mask and stencil mask holes can be used to calculate the solder bead height and length. The height of the resulting solder bead may be determined by the area of the solder mask hole 17 and the volume of the solder paste applied to the board or the pre-reflow solder paste. The area of the hole 17 in the solder mask 16 is: Area=$W*L+\Pi*(W/2)^2$. The pre-reflow solder paste volume is the area of the solder stencil hole multiplied by the stencil thickness T. That is the pre-reflow solder paste volume=$T*D^2$. Since solder paste, by volume, is approximately 50% flux, about 50% of the paste volume will be left as a solder bead 18 after the reflow process step. That is, the post-reflow solder bead 18 volume=$T*D^2/2$. The height H of the bead 18 may be such that the resultant bead 18, standing on the underlying signal trace 12, will protrude above the solder mask 16 by 2 to 3 thousandths of an inch. The height H of bead 28 is approximately the post-reflow solder volume divided by the solder mask-opening-area or:

$$H=(T*D^2/2)/(W*L+\Pi*(W/2)^2)$$

Given stencil thickness T, stencil hole diameter D, solder mask opening width W, and bead height H, than bead length L is approximately:

$$L=((T*D^2/2)/(H*W))-\Pi*W/4$$

Although one embodiment of the present invention has been shown and described, it will be appreciated by those skilled in the art that changes may be made in these embodiments without departing from the principles and spirit of the invention, the scope of which is defined in the claims and their equivalents. For example, the alignment features 104, 106, 114 and 116 are shown as holes, but may be any known alignment feature. The connection between elements may be between two or more circuit boards. One circuit board may have an array of solder beads or bumps on its larger flat face with the mating circuit board having contact pads on its edge or vice versa. The circuit board with the contact pads would be mounted at a right angle to the circuit board with the solder beads and the two circuit boards would be clamped together.

What is claimed is:

1. Apparatus, comprising:
   a target board having a first plurality of traces, and a plurality of localized high points of solder on respective ones of the first plurality of traces;
   a connecting board having a second plurality of traces, wherein the second plurality of traces form a plurality of edge contact pads along an edge of the connecting board; and
   an alignment and retention member for receiving and retaining the connecting board at a right angle to the target board, aligning the edge contact pads with the localized high points of solder, and retaining the edge contact pads in compressive contact with the localized high points of solder.

2. The apparatus of claim 1, wherein the alignment and retention member has one or more U-shaped extensions that wrap around the connecting board, the edge contact pads on the connecting board extending through the alignment and retention member.

3. The apparatus of claim 1, wherein the connecting board is a flex circuit.

4. The apparatus of claim 1, wherein each of the localized high points of solder has i) a width that is substantially the same width as its respective trace, and ii) a length that is larger than its width.

5. The apparatus of claim 4, wherein each of the localized high points of solder has a hemi-ellipsoidal shape.

6. The apparatus of claim 1, wherein the alignment and retention member comprises one or more stand-off features to control the compressive contact between the edge contact pads and the localized high points of solder.

* * * * *